United States Patent [19]
Contreras et al.

[11] Patent Number: 5,323,278
[45] Date of Patent: Jun. 21, 1994

[54] LOW NOISE AMPLIFIER CIRCUIT FOR MAGNETORESISTIVE SENSORS FOR FAST READ-WRITE SWITCHING IN LOW SUPPLY VOLTAGE APPLICATIONS

[75] Inventors: John T. Contreras, San Jose; Stephen A. Jove, Watsonville; Klaas B. Klaassen; Jacobus C. Leonardus van Peppen, both of San Jose, all of Calif.

[73] Assignee: International Business Machines Corporation, Armonk, N.Y.

[21] Appl. No.: 946,208

[22] Filed: Sep. 17, 1992

[51] Int. Cl.$^5$ .......................... G11B 5/02; G11B 5/33; G11B 5/127
[52] U.S. Cl. .......................... 360/67; 360/113
[58] Field of Search .............. 360/67, 66, 68, 113, 360/46, 55, 75, 45, 62, 77

[56] References Cited

U.S. PATENT DOCUMENTS

| | | | |
|---|---|---|---|
| 4,390,911 | 6/1983 | Klaassen | 360/62 X |
| 4,420,776 | 11/1983 | Jove et al. | 360/45 |
| 4,706,138 | 11/1987 | Jove et al. | 360/67 |
| 4,712,144 | 12/1987 | Klaassen | 360/67 |
| 4,786,993 | 11/1988 | Jove et al. | 360/67 |
| 4,879,610 | 11/1989 | Jove et al. | 360/67 |
| 5,032,935 | 7/1991 | Jove et al. | 360/67 |
| 5,103,353 | 4/1992 | Jove et al. | 360/67 |
| 5,130,866 | 7/1992 | Klaassen et al. | 360/55 X |
| 5,168,395 | 12/1992 | Klaassen et al. | 360/68 X |
| 5,204,789 | 4/1993 | Jove et al. | 360/67 |

*Primary Examiner*—Donald Hajec
*Assistant Examiner*—Patrick Wamsley
*Attorney, Agent, or Firm*—Henry E. Otto, Jr.

[57] ABSTRACT

A data storage system comprises magnetoresistive (MR) sensing elements for sensing data from a recording medium that is referenced to ground, and an amplifier circuit including a biasing stage, an amplifying stage, and a matching stage, each referenced to a common supply voltage source and to ground. The biasing stage includes a reference current source for selectively biasing each MR element with a constant current and, in so doing, developing a single-ended voltage signal having a first dc component. The amplifying stage converts the single-ended voltage signal into an amplified single-ended output voltage signal having a second dc component but in which the first dc component is eliminated. The matching stage creates a bias and imposes said bias on the amplifying stage for converting the single-ended output voltage signal to a differential output voltage signal in which the second dc component is eliminated.

10 Claims, 2 Drawing Sheets

LOW NOISE AMPLIFIER CIRCUIT FOR MAGNETORESISTIVE SENSORS FOR FAST READ-WRITE SWITCHING IN LOW SUPPLY VOLTAGE APPLICATIONS

This invention relates to disk storage systems employing amplifiers for (i) amplifying signals from magnetoresistive (MR) sensors to detect a read signal and (ii) biasing and switching said sensors. More particularly, it relates to an improved low-noise amplifier circuit for MR sensors that provides fast read-write switching and can operate with low supply voltages and a single (grounded) power supply.

BACKGROUND OF THE INVENTION

Commonly assigned U.S. application Ser. No. 07/914,278, filed Jun. 15, 1992, entitled "Low-Voltage, Low-Power Amplifier For Magnetoresistive Sensor" discloses low-noise, low-power, low-voltage amplifier circuits with a single-ended input having no common mode rejection for concurrently biasing and amplifying signals generated by magnetoresistive (MR) sensing elements in a disk storage system. The amplifier circuits comprise a single (grounded) supply voltage source. The head/disk assembly of the disk file is completely enclosed by a highly conductive electrostatically shielded metallic enclosure that operates as a Faraday cage and isolates leads connecting the MR elements with the amplifier circuit from large, fast rise/fall time voltage transients.

These circuits operate very satisfactorily at supply voltages of as low as 4.5 volts. However, there is a need for amplifier circuits having configurations that not only include a single-ended input to eliminate common mode rejection and use a single (grounded) supply voltage, as taught in the application just cited, but also permit operation with supply voltages as low as three volts. This need arises because MR sensors are now being proposed for use with battery-operated low-end storage devices, such as hard disk drives for lap-top and notebook computers. These types of devices require actuator-electronics (AE) modules with extremely low power consumption and supply voltages of less than 4.5 volts.

SUMMARY OF THE INVENTION

A disk storage device is disclosed which includes an amplifier circuit for amplifying and biasing signals generated by MR sensing elements. The circuit comprises a biasing stage, an amplifying stage and a matching stage, each of which is referenced to a common ground and a common supply voltage source.

The biasing stage comprises a reference current source for biasing the MR element with a constant current. The amplifying stage converts a single-ended voltage signal from the MR element into an amplified single-ended output voltage signal in which a dc component of the voltage signal is eliminated. The matching stage converts the single-ended output voltage signal to a differential output voltage signal without need for a feedback circuit. A gain degeneration resistor in the amplifying stage and a pair of level-shifting resistors in the matching stage adjust gain of the amplifying stage and/or prevent saturation of the amplifier circuit. The amplifying stage preferably includes an isolation resistor interposed between the biasing stage and ground for preventing saturation of the amplifying stage and minimizing sensitivity of the amplifier circuit to noise caused by stray ground currents in proximity of wiring connecting the MR element with the amplifier circuit.

Each circuit configuration disclosed will operate satisfactorily at supply voltages as low as three volts and provide head switching, low noise, programmable bias current, as well as programmable gain.

The amplifier circuits herein disclosed, when incorporated in the preamplifier circuit portion of a low-voltage MR actuator-electronics module, operate satisfactorily at power supply voltages as low as about three volts.

DESCRIPTION OF PREFERRED EMBODIMENTS

FIG. 1

Figure 1:
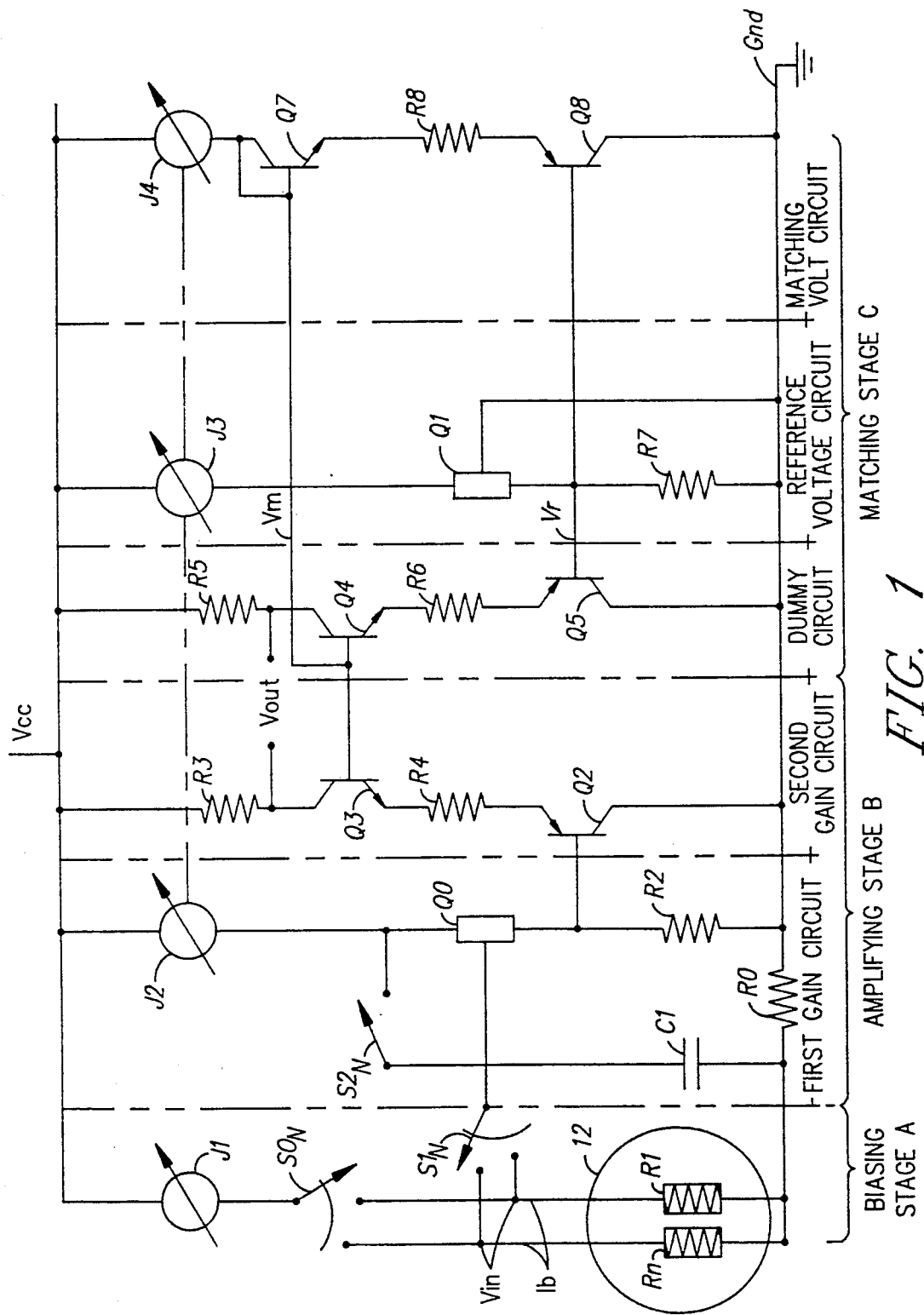
FIG. 1 is a schematic diagram of an amplifier circuit according to one embodiment of the invention.

As illustrated in FIG. 1, the amplifier circuit 10 according to this embodiment of the invention is employed as a preamplifier circuit for a plurality of MR sensing elements (called heads) in a disk storage system. Circuit 10 amplifies signals from a selected one of the MR heads to facilitate detection of an electrical signal read by the selected head from a storage disk 12. Circuit 10 also biases the selected head and selectively switches between heads. For simplification, only two MR heads R1, Rn are shown.

Amplifier circuit 10 comprises a biasing stage A, an amplifying stage B, and a matching stage C, each of which is referenced to a common supply voltage source Vcc and to a common ground gnd.

Biasing Stage

Biasing stage A biases the selected MR head (hereinafter assumed as R1) with a prescribed bias current Ib from a current source J1. This bias current Ib preferably is derived from bandgap reference voltage that is internal to a silicon chip and transformed into the bias current by a precision reference resistor (not shown). This bias current source J1 as well as all of the current sources in circuit 10 can be temporarily turned off during idle (i.e., standby) mode operation as denoted by the positions in which the switch arms of switches $S0_N$ and $S1_N$ are shown in FIG. 1. Switch $S0_N$ controls connection of the heads with source J1, whereas switch $S1_N$ controls connection of the heads with the amplifying stage B.

A bias voltage Vb, which is the product of the bias current Ib and the steady state (i.e., dc) resistance of head R1, is thus developed across the selected MR head R1. A voltage signal also is developed across MR head R1 when it is biased by voltage Vb and magnetic flux reversals are sensed as data read from disk 12. The bias voltage Vb and signal voltage are present at node Vin at one end of MR head R1 when the other end of the head is connected to ground. When the biasing stage A is connected to the amplifying stage B, the said other end of head R1 is forced to be ac ground; i.e., a "lo" terminal. This leaves node Vin as a "hi" terminal at which the voltage signal to be amplified resides.

Amplifying Stage

Amplifying stage B has two gain circuits. The first gain circuit comprises an input device Q0, an input bias current source J2, a first load resistor R2, a capacitor C1 and preferably also an isolation resistor R0. The purpose of this first gain circuit is to eliminate the dc component of the voltage signal at the output of the first gain circuit and to determine the low frequency (−3 dB) point of the amplifier circuit. A switch $S2_N$ holds a voltage on capacitor C1 during idle mode operation by temporarily disconnecting capacitor C1 from the rest of the circuit.

input device Q0 can be a PNP bipolar transistor with its base connected to node Vin, its collector connected to load resistor R2, and its emitter connected to current source J2 and to capacitor C1. Current source J2 serves to provide a biasing current for the input device Q0. The product of the biasing current and the transistor alpha will result in a portion of the current from source J2 flowing through resistor R2. However, most of the biasing current from source J2 flows through load resistor R2.

Isolation-resistor R0 can be used to effect a slight increase in the dc potential at Vin. This increase at node Vin desirably prevents saturation of input device Q0 and minimizes the sensitivity to noise potentials caused by stray ground currents proximity of the wiring connecting the MR head to the preamplifier circuit. Use of isolation resistor R0 can, however, raise the overall potential of the MR head relative to system ground and thereby intensify the detrimental effects of a conductive asperity contact between the exposed magnetoresistive stripe of the MR head and conductive substrate of the magnetic recording disk 12.

Capacitor C1 eliminates noise from current source J2 and noise from isolation resistor R0 in the bandwidth of interest (i.e., the bandwidth of the voltage signal developed across the MR head). The gain of the first gain circuit is the ratio of the resistance of resistor R2 over the equivalent emitter resistance calculated by taking the ratio of the thermal voltage over the emitter current, which is the magnitude of the current from source J2.

If preferred, however, input device Q0 can be an enhancement mode PFET transistor with its gate connected to node Vin, its drain connected to resistor R2 and its source connected to current source J2 and to capacitor C1. As before, current source J2 serves to provide a biasing current for the input device Q0. However, the entire biasing current from source J2 will now flow through load resistor R2. To prevent saturation of input device Q0, the optional isolation resistor R0 can be used, as earlier explained, to effect a slight increase in the dc potential at Vin; but its use can, however, produce the undesired effects previously explained. Capacitor C1, as before, eliminates noise from current source J2 and noise from isolation resistor R0 in the bandwidth of interest.

If the input device Q0 is a PFET, the gain of the first gain circuit will be proportional to the resistance of resistor R2 and the transconductance of device Q0. This transconductance is proportional to the drain current from source J2 and to the width to length ratio of the PFET.

The low frequency rolloff required in the first gain circuit can be calculated using the RC time constant of the capacitor C1 and equivalent resistance at the emitter (if Q0 is a bipolar transistor) or at the drain (if Q0 is a PFET).

The second gain circuit comprises a second load resistor R3, a degeneration resistor R4, a level-shifting device Q2, and an output device Q3. Level-shifting device Q2 shifts the level of the amplified signal voltage across resistor R2 to one end of gain degeneration resistor R4. Output device Q3 amplifies the shifted version of the amplified signal voltage at the other end of degeneration resistor R4, where it appears as an output signal at one end of second load resistor R3. The gain of the second gain circuit can be calculated as the ratio of the resistance of R3 to the effective emitter/degeneration resistance Re. Resistance Re is the sum of the resistances of degeneration resistor R4 and of the emitters of transistors Q3 and Q2. Also, output device Q3 is biased at its base by a matching voltage Vm from matching stage C.

Matching Stage

Matching stage C converts the single-ended output signal of amplifying stage B into a differential signal suitable for further signal processing. Matching stage C is connected to and matched to amplifying stage B; i.e., many current sources and devices in both circuits are matched to each other. This matching is achieved by physically placing critical circuit elements close to each other and scaling or matching these elements and critical current sources, such as source J3 in matching stage C with source J2 in amplifier stage B.

The term "matching", as used in the specification and claims, is intended generically to connote either a direct matching of currents or voltages in stages B and C or a ratio relationship between such currents or voltages.

Matching stage C comprises a reference voltage circuit, a dummy circuit, and a matching voltage circuit. The reference voltage circuit comprises matched current source J3 and a reference voltage resistor R7. Source J3 develops a reference voltage Vr across resistor R7. The purpose of this reference voltage circuit is to duplicate, across resistor R7 of matching stage C, the voltage which is seen across resistor R2 of amplifying stage B. Thus, the aforementioned currents are not only closely matched but also the resistances of R7 of the matching stage and R2 of the amplifying stage are matched to ensure that the reference voltage Vr will be of proper magnitude to eventually develop a matching voltage Vm.

If input device Q0 in amplifying stage B is a FET, no dummy device is required in the reference voltage circuit. However, if the input device Q0 is a bipolar transistor, the reference voltage circuit should also include a bipolar dummy device Q1. This dummy device is required because a bipolar transistor as the input device Q0 requires a biasing current to its base and hence not all of the current from source J2 arrives at resistor R2 in amplifying stage B. Thus the purpose of the dummy device is to ensure a proper reference voltage Vr by reducing the amount of current from source J3 arriving at resistor R7 in matching stage C to the same degree as the amount of reduction of current from source J2 arriving at resistor R2.

The matching voltage circuit comprises a first mirror transistor Q7, a level-shifting resistor RS, a second mirror transistor Q8, and a matching voltage-setting current source J4. The purpose of this circuit is to set up a matching voltage Vm at a predetermined difference from the reference voltage Vr.

The dummy circuit comprises, one mirror transistor Q5, a level-shifting resistor R6, another mirror transistor Q4, and a dummy load resistor R5.

Reference voltage Vr ensures that whatever current value is chosen for current source J4 that same value of current will also flow through the dummy circuit. This will be true provided mirror transistor Q5 of the dummy circuit is matched with mirror transistor Q8 of the matching voltage circuit, and mirror transistor Q4 of the dummy circuit is matched with transistor Q7 of the matching voltage circuit. Level-shifting resistor R6 of the dummy circuit is matched with resistor R8 of the matching voltage circuit.

If bipolar devices are used, mirror transistor Q7 would be diode-connected as shown in FIG. 1 and mirror transistor Q4 of the dummy circuit would be of the same type and connected as a mirror device as shown. Moreover, device Q3 of the amplifying stage B is matched to mirror transistor Q4 of the dummy circuit, and degeneration resistor R4 of the amplifying stage B is matched to level-shifting resistor R6 of the dummy circuit, and level-shifting device Q2 of the amplifying stage is matched to mirror transistor Q5 of the dummy circuit.

Under this condition, with the bases of the mirror transistors Q4 and Q7 interconnected, matching voltage Vm will cause equal currents to flow through the dummy circuit and through the second gain circuit of amplifying stage B. This ensures that if load resistor R3 of the amplifying stage is matched to the load resistor R5 of the dummy circuit, the output voltage Vout will have no dc component (offset). It is thus possible to match the base-emitter voltage Vbe and the dc beta for bipolar devices, or the threshold voltage and transconductance for FET devices, or sheet resistivity and temperature coefficients of the resistors.

If degeneration resistor R4 of amplifying stage B is not needed, level-shifting resistors R6 and R8 of the matching stage C should be eliminated.

From the foregoing, it will be apparent that the amplifier circuit embodying the invention provides a differential voltage output signal Vout that is free of dc offset and constitutes an amplified version of the voltage signal sensed at MR head R1. The matching stage C need only insure that the dc voltage at Vout is near zero. This, of course, could be achieved without precisely matching the aforementioned resistors, transistors and current sources, but instead ratioing the currents and resistances in such manner as to achieve a near zero dc voltage Vout. The manner in which the circuit of FIG. 1 would be modified to implement such a ratioing approach is believed to be apparent to those skilled in the art, and therefore will not be specifically described.

FIG. 2

Figure 2:
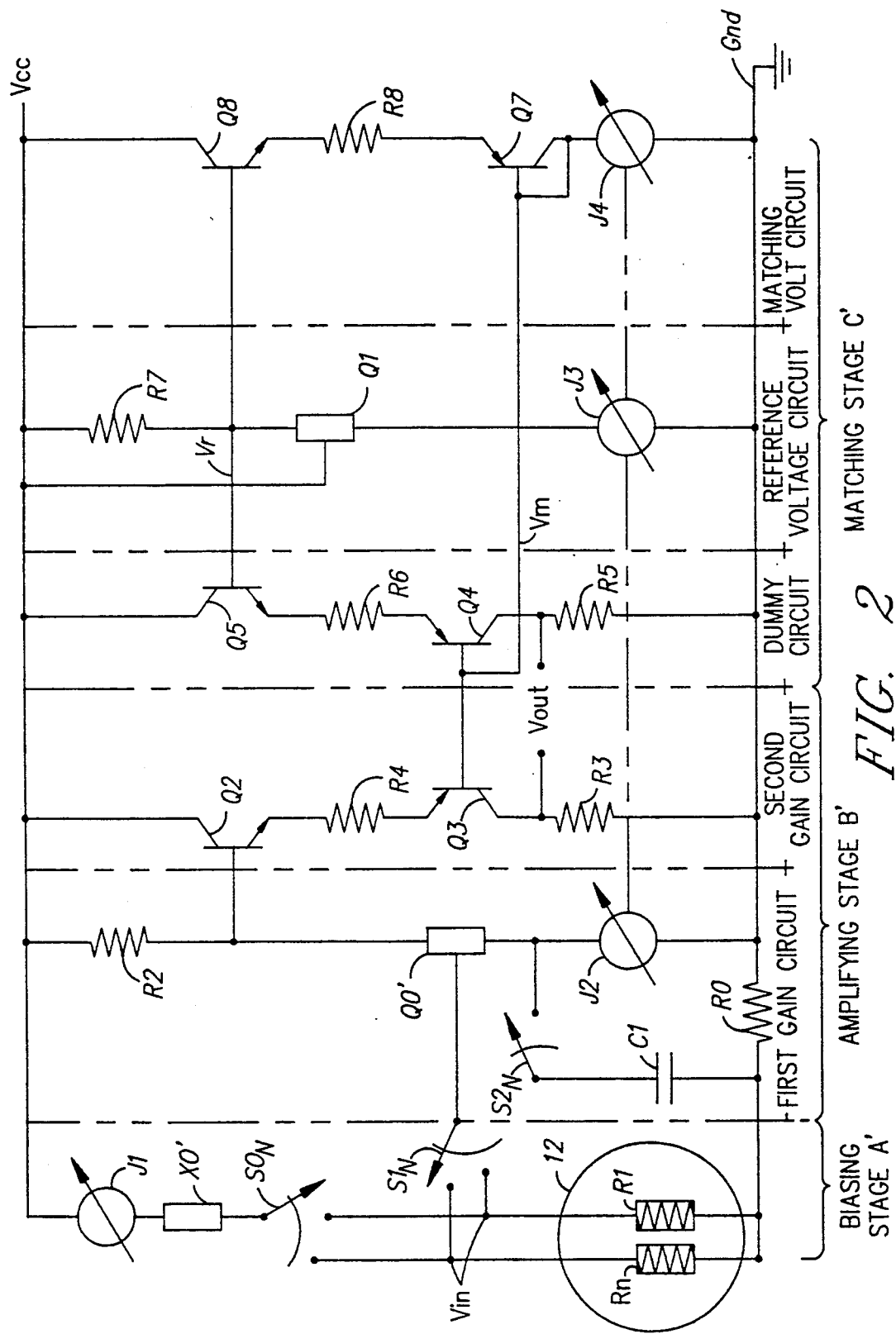
FIG. 2 is a schematic diagram of an amplifier circuit according to a modified embodiment of the invention.

The modified embodiment illustrated in FIG. 2 also comprises a biasing stage A', an amplifying stage B', and a matching stage C'. The primary difference between this embodiment and that of FIG. 1 is in the biasing stage A', although there are some differences in stages B' and C'. Therefore, components identical in configuration and function with those in the FIG. 1 embodiment will be identified by the same reference numerals.

Biasing Stage

Biasing stage A' comprises current source J1 and switches $S0_N$ and $S1_N$, which perform the same functions as in the embodiment of FIG. 1. If isolation resistor R0 is used in amplifying stage B' and the magnitude of that isolation resistance is sufficiently great, biasing stage A' also preferably includes a level-shifting device X0'. The purpose of device X0' is to elevate the voltage at the most positive terminal of MR head R1 to a point at which subsequent amplification can be accomplished by the amplifying stage using input device Q0'.

Device X0' may be any device which can be used as a level-shifter (or differential voltage reference). Therefore, it may be an NPN bipolar transistor with its base and collector diode-connected together, or an enhancement mode NFET with its gate and drain connected together, or it may even be a resistor if statistical tolerances permit. Preferably, device X0' is a diode if amplifying stage B' uses a bipolar transistor as the input device Q0; or device X0' is a FET with interconnected gate and drain if the amplifying stage uses a FET as the input device.

Whether or not level-shifting device X0' is used, the potential at node Vin can be raised without incurring added noise by including the isolation resistor R0 in the amplifying stage B'. The need to elevate the potential at node Vin above the potential at Vin in the embodiment of FIG. 1 results from the design of the input biasing-current circuitry in the amplifying stage.

Amplifying Stage

The amplifying stage B' is generally similar to amplifying stage B except for the first gain circuit. Capacitor C1, current source J1, devices Q0, Q2 and Q3, switch $S2_N$, and resistors R0, R2, R3 and R4 perform the same functions in this embodiment as they performed in the embodiment of FIG. 1. However, input device Q0' is now changed from a bipolar PNP transistor to a bipolar NPN transistor or from an enhancement mode PFET to an enhancement mode NFET (or a LFET, which is a low threshold NFET).

If a bipolar transistor is used as the input device Q0', its base is connected to node Vin via switch $S1_N$, its collector is connected to load resistor R2 and its emitter is connected to input bias source J2. If a FET is used as the input device Q0', however, its gate is connected via switch $S1_N$ to node Vin, its drain is connected to the load resistor R2, and its source is connected to current source J2.

Irrespective of which type of input devices Q0' is used, the amplified signal voltage across load resistor R2 must be referenced to the positive supply voltage source Vcc rather than to ground. Current source J2 therefore has little dynamic headroom (voltage compliance) in which to work without saturation. A headroom limitation is imposed on source J2 because the bias voltage that appears across the MR head R1 can be very small and a voltage is required between the base or gate of the input device Q0' at node Vin and the capacitor C1. Including the isolation resistor R0 will help to prevent saturation of the input bias current source J2.

Because the amplified voltage signal is referenced to the positive supply source Vcc instead of to ground, the devices in the second gain circuit must be transposed such that NPN devices in the FIG. 1 embodiment now become PNP devices and vice versa This change requires that the load resistor R3 in the second gain stage be referenced to ground.

Matching Stage

In order properly to bias the second gain-circuit, the NPN devices used in the embodiment of FIG. 1 must now be transformed to PNP devices, and vice versa. Matching stage C' is similar to matching stage C in that devices Q1, Q4, Q5, Q7 and Q8, as well as resistors R6, R7 and R8, and current sources J3 and J4 perform exactly the same functions as they respectively performed in the earlier embodiment. As before, dummy device Q1 is included only if a bipolar transistor is used at the input device Q0' in the amplifying stage. Thus, this embodiment, similar to that of FIG. 1, will provide a differential voltage output signal Vout free of dc offset and constituting an amplified version of the voltage signal sensed at MR head R1.

In each embodiment, one of the current sources (J2, J3, J4) is adjustable for changing its current and, by automatically causing the remaining current sources to provide matching currents, correspondingly varying the gain of the amplifier circuit.

While the invention has been described in connection with two embodiments, it will be understood by those skilled in the art that various changes in form may be made without departing with the teachings of the invention. Accordingly, the invention is not to be deemed limited in scope except as required by the appended claims.

We claim:

1. A data storage system comprising:
   at least one data storage medium on which data is recorded and which is referenced to ground;
   at least one magnetoresistive (MR) sensing element for sensing the data from the medium; and
   an amplifier circuit comprising a biasing stage, an amplifying stage, and a matching stage, each referenced to a common supply voltage source and to the ground;
   (i) said biasing stage including a reference current source (J1) for selectively biasing each said MR element with a constant current and, in so doing, developing a single-ended voltage signal having a first dc component,
   (ii) said amplifying stage serving to convert the single-ended voltage signal into an amplified single-ended output voltage signal having a second dc component but in which the first dc component is eliminated, and
   (iii) said matching stage serving to create a bias and impose said bias on the amplifying stage for converting the single-ended output voltage signal to a differential output voltage signal in which the second dc component is eliminated, and including a pair of level shifting resistors (R6, R8) for adjusting gain of the amplifying stage and/or preventing saturation of the amplifier circuit.

2. The system of claim 1, wherein the amplifying stage includes an isolation resistor (R0) interposed between the biasing stage and ground for preventing saturation of the amplifying stage and minimizing sensitivity of the amplifier circuit to noise caused by stray ground currents in proximity of wiring connecting each MR element with the amplifier circuit.

3. The system of claim 1, including a gain degeneration resistor (R4) in the amplifying stage.

4. The system of claim 1, including a plurality of current sources (J2, J3, J4), at least one of which is adjustable for changing current and causing the remaining current sources to provide matching currents for thereby automatically correspondingly varying gain of the amplifier circuit.

5. The system of claim 1, wherein the amplifying stage comprises:
   a first gain circuit for eliminating the first dc component of the voltage signal; and
   a second gain circuit on which the bias is imposed by a matching voltage (Vm) generated by the matching stage for ensuring that the differential output voltage signal has no second dc component.

6. The system of claim 5, wherein the first gain circuit comprises one biasing current source (J2), an input device (Q0), a first load resistor (R2), and a capacitor (C1), said biasing current source being connected to one voltage reference source (Vcc or ground), and to one terminal of said input device, said first load resistor having one end connected to another terminal of said input device and its other end connected to another voltage reference source (ground or VCC), said capacitor being interposed between ground and said one terminal of said input device, each MR element being selectively interposed between ground and a control terminal of said input device; and
   the second gain circuit comprises a second load resistor (R3), a level-shifting device (Q2), all output device (Q3), and a degeneration resistor (R4), said second load resistor being interposed between said one reference voltage source and one terminal of said output device, said degeneration resistor being interposed between another terminal of said output device and one terminal of the level-shifting device, another terminal of the level-shifting device being connected to said other voltage reference source (ground or Vcc), a terminal of the level-shifting device being connected to said one end of said first load resistor, and a control terminal of the output device having imposed thereon a voltage provided by the matching stage.

7. The system of claim 1, wherein the matching stage comprises:
   a reference voltage circuit for replicating the second dc component of the amplified voltage signal to generate a reference voltage;
   a dummy circuit for providing one half of the differential output voltage signal, the other half of which is provided from one gain circuit of said amplifying stage; and
   a matching voltage circuit for developing a matching voltage for providing equal bias to said one gain circuit and to the dummy circuit.

8. The system of claim 5, wherein the amplifying stage includes a bipolar input device, and the reference voltage circuit includes a bipolar device for insuring that loss in current due to biasing of the bipolar input device is matched in the reference voltage circuit.

9. The system of claim 7, wherein the dummy circuit comprises first and second mirror transistors (Q5, Q4), one level-shifting resistor (R6), and a dummy load resistor (RS), said first mirror transistor (Q5) being connected to the reference voltage provided by said reference voltage circuit, and said second mirror transistor (Q4) being connected via said one level-shifting resistor to said first mirror transistor and dummy load resistor and to the output device in the amplifying stage; and
   the matching voltage circuit comprises a matching voltage-setting current source (J4), third and fourth mirror transistors (Q7, Q8), and another level-shifting resistor (R8), said third and fourth mirror transistors being interconnected via said other level-shifting resistor, and said voltage-setting current source (J4) being connected to said first mirror transistor and to said second mirror transistor and to said output device for providing a current through said third and fourth mirror transistors and said other level-shifting transistor for developing a matching voltage that is adjusted relative to the reference voltage to achieve equal biasing of the dummy circuit and amplifying stage.

10. The system of claim 7, wherein the amplifying stage includes one gain circuit having a load resistor (R2) and another gain circuit having a bias current source (J2); and the reference voltage circuit includes a current source (J3) matched to the bias current source, and a resistor (R7) connected to the current source (J3) and matched to the load resistor (R2) to create a reference voltage (Vr).

* * * * *

UNITED STATES PATENT AND TRADEMARK OFFICE
CERTIFICATE OF CORRECTION

PATENT NO. : 5,323,278
DATED : June 21, 1994
INVENTOR(S) : J. T. Contreras

It is certified that error appears in the above-indentified patent and that said Letters Patent is hereby corrected as shown below:

Column 4, line 64, delete "RS", insert -- R8 --.

IN THE CLAIMS

Column 8, line 57, delete "(RS)", insert -- R5 --.

Column 9, line 2, after transistor, insert -- (Q4) --.

Column 9, line 2, delete "second", insert -- third --.
Column 9, line 3, after transistor, insert -- (Q7) --.

Column 9, line 5, delete "transistor", insert -- resistor (R8) --.

Signed and Sealed this

Eighth Day of November, 1994

Attest:

BRUCE LEHMAN

*Attesting Officer*    *Commissioner of Patents and Trademarks*